US009059226B2

(12) United States Patent
Muramoto

(10) Patent No.: US 9,059,226 B2
(45) Date of Patent: Jun. 16, 2015

(54) SUBSTRATE TREATMENT APPARATUS

(75) Inventor: Ryo Muramoto, Kyoto (JP)

(73) Assignee: SCREEN Holdings Co., Ltd. (JP)

( * ) Notice: Subject to any disclaimer, the term of this patent is extended or adjusted under 35 U.S.C. 154(b) by 221 days.

(21) Appl. No.: 13/415,438

(22) Filed: Mar. 8, 2012

(65) Prior Publication Data

US 2012/0234364 A1 Sep. 20, 2012

(30) Foreign Application Priority Data

Mar. 18, 2011 (JP) ................. 2011-061479

(51) Int. Cl.
*B08B 3/04* (2006.01)
*H01L 21/677* (2006.01)
*H01L 21/67* (2006.01)

(52) U.S. Cl.
CPC .... *H01L 21/67742* (2013.01); *H01L 21/67028* (2013.01); *H01L 21/67051* (2013.01); *H01L 21/67766* (2013.01)

(58) Field of Classification Search
CPC .............. H01L 21/67051; H01L 21/67028; H01L 21/67178; H01L 21/67742; H01L 21/67184; H01L 21/67196; H01L 21/67745; H01L 21/67034; H01L 21/6708; H01L 21/6715; H01L 21/6719; H01L 21/67748; H01L 21/67766; G03F 7/168; G03F 7/3021; G03F 7/2041; G03F 7/70925; Y10S 134/902

USPC ......... 134/1.1, 1.3, 56 R, 61, 84, 94.1, 104.1, 134/133, 135, 137, 172; 118/620, 642, 62, 118/58, 66, 500, 696, 52, 400; 396/611, 396/572, 575, 624; 414/147, 935, 604; 427/299, 430.1

See application file for complete search history.

(56) References Cited

U.S. PATENT DOCUMENTS

| 2001/0000477 A1* | 4/2001 | Harada ................. 427/534 |
| 2001/0007259 A1* | 7/2001 | Nakashima et al. ........ 134/32 |
| 2009/0053020 A1 | 2/2009 | Okuno ................. 414/222 |
| 2010/0068014 A1 | 3/2010 | Mitsuyoshi et al. ..... 414/225.01 |
| 2010/0279014 A1 | 11/2010 | Hiroki ................. 427/294 |

FOREIGN PATENT DOCUMENTS

| JP | 11-040642 | 2/1999 |
| JP | 11-254317 | 9/1999 |

(Continued)

OTHER PUBLICATIONS

Kenichiro et al., JP 11-254317 "Work grinding method and work grinding device" Machine Translation, Sep. 21, 1999.*

(Continued)

*Primary Examiner* — Michael Barr
*Assistant Examiner* — Thomas Bucci
(74) *Attorney, Agent, or Firm* — Ostrolenk Faber LLP

(57) ABSTRACT

The substrate treatment apparatus includes a first substrate transport robot having a hand which holds a substrate, a second substrate transport robot having a hand which holds the substrate, and a hand cleaning unit which cleans the hand of the first substrate transport robot and the hand of the second substrate transport robot. The hand cleaning unit is configured to be accessible by the hand of the first substrate transport robot and the hand of the second substrate transport robot, and is disposed above or below a substrate transfer place at which the substrate is transferred between the first and second substrate transport robots.

20 Claims, 10 Drawing Sheets

(56) References Cited

FOREIGN PATENT DOCUMENTS

| | | |
|---|---|---|
| JP | 11-260887 | 9/1999 |
| JP | 2000-68244 | 3/2000 |
| JP | 2007-311691 | 11/2007 |
| JP | 2009-164213 | 7/2009 |
| JP | 2009-212335 | 9/2009 |
| JP | 2010-045207 | 2/2010 |
| KR | 10-2009-0019686 | 2/2009 |
| KR | 10-2009-0095501 | 9/2009 |
| KR | 10-2010-0031458 | 3/2010 |
| KR | 10-2010-0046897 | 5/2010 |

OTHER PUBLICATIONS

Kenji et al., JP 2009-212335 "Conveyor arm cleaning device, conveyor arm cleaning method, program, and computer storage medium" Machine Translation, Sep. 17, 2009.*

* cited by examiner

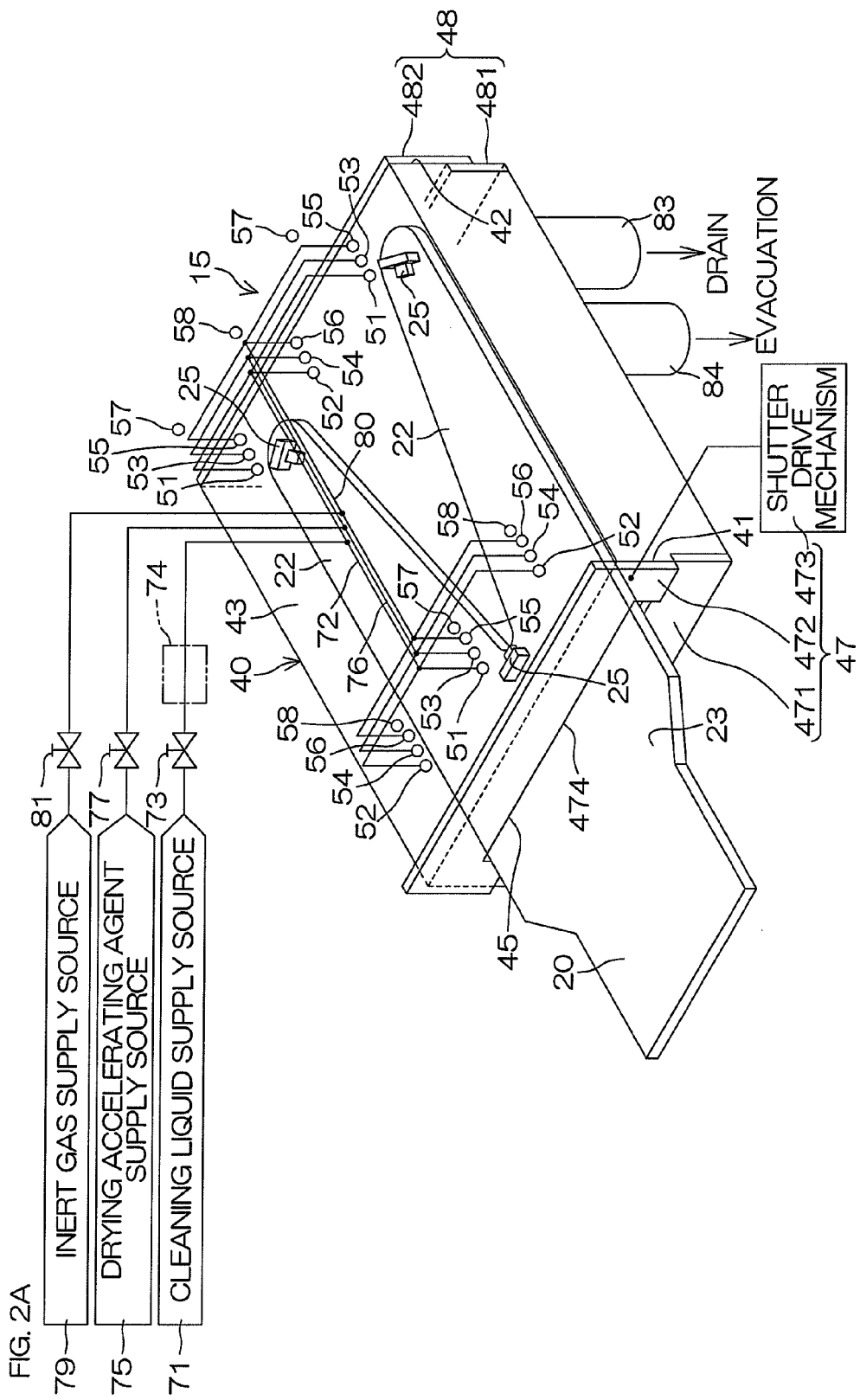

SUBSTRATE TREATMENT APPARATUS

BACKGROUND OF THE INVENTION

1. Field of the Invention

The present invention relates to a substrate treatment apparatus having two substrate transport robots which transfer a substrate therebetween. Exemplary substrates to be treated include semiconductor wafers, substrates for liquid crystal display devices, substrates for plasma display devices, substrates for FED (Field Emission Display) devices, substrates for optical disks, substrates for magnetic disks, substrates for magneto-optical disks, substrates for photo masks, ceramic substrates, and substrates for solar cells.

2. Description of Related Art

One exemplary substrate treatment apparatus to be used in a process for producing semiconductor devices and liquid crystal display devices is of a single substrate treatment type adapted to treat a single substrate at a time. The substrate treatment apparatus of the single substrate treatment type includes an indexer robot which transports a substrate between a substrate container such as a cassette and a substrate transfer position, a plurality of treatment units, and a main transport robot which transports the substrate between the substrate transfer position and any one of the treatment units. The indexer robot and the main transport robot each have a hand capable of holding a single substrate. The treatment units are each adapted, for example, to perform a substrate surface treatment by supplying a treatment liquid (a chemical liquid or deionized water) to the substrate.

If foreign matter is adhered to the substrate, the foreign matter is liable to be transferred to the hand to contaminate the hand. Further, if the treatment liquid remains on the substrate after the substrate is treated with the treatment liquid, the treatment liquid is liable to be partly transferred to the hand which holds the substrate. If the transferred foreign matter and/or the transferred treatment liquid are accumulated on the hand, the accuracy of a substrate holding position at which the substrate is held on the hand is likely to be deteriorated. If the substrate is held at an inaccurate position on the hand, the substrate positioning accuracy at the substrate transfer position is liable to be deteriorated. This may result in failures (transportation failures) in substrate transfer between the indexer robot and the main transport robot, between the main transport robot and the treatment units and between the indexer robot and the substrate container, and the like. That is, the substrate is liable to fall out or to be broken.

To cope with such problems, it is conceivable to provide a hand cleaning unit as disclosed in JP-A-2000-68244. In an apparatus disclosed in JP-A-2000-68244, however, an object loading unit, the hand cleaning unit, an object cleaning unit, an object cleaning/drying unit and an object unloading unit are disposed around a transport robot in a so-called cluster configuration. In the cluster configuration, the hand cleaning unit takes up substantially as much space as that of the object cleaning unit or the object cleaning/drying unit (which are adapted to clean a semiconductor wafer). This disadvantageously reduces the space utilization efficiency, thereby correspondingly increasing the footprint (occupation area) of the apparatus.

SUMMARY OF THE INVENTION

The present invention provides a substrate treatment apparatus which includes a hand cleaning arrangement provided therein without substantial increase in the footprint of the apparatus.

The substrate treatment apparatus according to the present invention includes: a first substrate transport robot having a hand which holds a substrate; a second substrate transport robot having a hand which holds the substrate; and a hand cleaning unit which is accessible by the hand of the first substrate transport robot and the hand of the second substrate transport robot for cleaning the hand of the first substrate transport robot and the hand of the second substrate transport robot, and is disposed above or below a substrate transfer place at which the substrate is transferred between the first and second substrate transport robots.

With this arrangement, the hand cleaning unit is disposed above or below the substrate transfer place at which the substrate is transferred between the first and second substrate transport robots. Therefore, the substrate transfer place and the hand cleaning unit are located in three-dimensional relation so as to at least partly overlap each other as seen in plan. Thus, the hand cleaning unit can be provided without substantial increase in the occupation area (footprint) of the substrate treatment apparatus, making it possible to clean the hands of the first and second substrate transport robots. This substantially prevents the transportation failures without substantially increasing the footprint of the substrate treatment apparatus, permitting the substrate treatment apparatus to reliably perform a substrate treatment.

The first substrate transport robot may be an indexer robot which transports the substrate between a substrate container provided in a substrate container retaining place and the substrate transfer place. Further, the second substrate transport robot may be a main transport robot which transports the substrate between the substrate transfer place and a treatment unit.

The substrate transfer place is preferably located between the first and second substrate transfer robots.

The treatment unit preferably includes a plurality of treatment units which are stacked at two or more levels to be three-dimensionally arranged. In this case, it is easy to provide a relatively large space above or below the substrate transfer place, so that the hand cleaning unit can be easily provided.

According to one embodiment of the present invention, the substrate treatment apparatus further includes a substrate holding unit disposed at the substrate transfer place for holding the substrate. With this arrangement, the substrate can be held by the substrate holding unit, which mediates the substrate transportation between the first and second substrate transfer robots. By locating the hand cleaning unit above or below the substrate holding unit, the hand cleaning function can be additionally provided without a substantial increase in the footprint of the substrate treatment apparatus.

The substrate holding unit may include a shuttle mechanism which transports the substrate between a first substrate transfer position at which the substrate is transferred with respect to the first substrate transfer robot and a second substrate transfer position at which the substrate is transferred with respect to the second substrate transfer robot.

The substrate may be transferred directly from one of the hands of the first and second substrate transport robots to the other hand without the provision of the substrate holding unit at the substrate transfer place.

The hand cleaning unit preferably includes a housing defining a hand treatment space in which the hands are each accommodated to be treated. This arrangement makes it possible to clean each of the hands in the hand treatment space (which is preferably a closed space), thereby preventing the substrate from being affected by the hand cleaning process.

The housing preferably has a hand receiving port through which the hands are each inserted into and retracted from the hand treatment space. This arrangement makes it possible to insert the hand into the hand treatment space through the hand receiving port, and then perform the hand cleaning process to clean the hand in the hand treatment space.

The hand receiving port preferably includes a first hand receiving port and a second hand receiving port provided at different positions. More specifically, the first hand receiving port is preferably directed toward the first substrate transport robot, and the second hand receiving port is preferably directed toward the second substrate transport robot. Thus, the hands of the first and second substrate transport robots can be cleaned in the common hand cleaning unit. This makes it possible to efficiently utilize the inside space of the substrate treatment apparatus to additionally provide the hand cleaning function.

Further, two or more such hand cleaning units may be provided. Where two hand cleaning units are provided, for example, the two hand cleaning units may be both located above the substrate transfer place or below the substrate transfer place, or the two hand cleaning units may be respectively located above and below the substrate transfer place. With the provision of the two or more hand cleaning units, a first substrate transport robot hand cleaning period and a second substrate transport robot hand cleaning period may overlap each other. That is, there is no need to stagger the first and second substrate transport robot hand cleaning periods, obviating the need for adjustment of the hand cleaning periods.

The housing may have a single hand receiving port. In this case, the hand cleaning unit preferably includes a first hand cleaning unit disposed with its hand receiving port directed toward the first substrate transport robot, and a second hand cleaning unit disposed with its hand receiving port directed toward the second substrate transport robot. Thus, the hands of the first and second substrate transport robots can be respectively cleaned in the first and second hand cleaning units. The first and second hand cleaning units may be both located above the substrate transfer place or below the substrate transfer place, or the first and second hand cleaning units may be respectively located above and below the substrate transfer place. With the provision of the first and second hand cleaning units, the first substrate transport robot hand cleaning period and the second substrate transport robot hand cleaning period may overlap each other. That is, there is no need to stagger the first and second substrate transport robot hand cleaning periods, obviating the need for the adjustment of the hand cleaning periods. Three or more hand cleaning units each having a single hand receiving port may be provided.

Further, a single hand cleaning unit having a single hand receiving port may be provided. The hands of the first and second substrate transport robots may be received through the single hand receiving port at different timings, and cleaned in different periods. Where the first and second substrate transport robots access the substrate transfer place from different directions, it is preferred to provide a unit rotation mechanism which rotates the hand cleaning unit so as to direct the hand receiving port of the hand cleaning unit in the different directions.

According to another embodiment of the present invention, the substrate treatment apparatus further includes a shutter mechanism which opens and closes the hand receiving port. This arrangement improves the sealability of the hand treatment space during a period in which the hand cleaning process is not performed. This substantially prevents the substrate from being affected by an atmosphere flowing out of the hand treatment space, and substantially prevents foreign matter from intruding into the hand treatment space.

An evacuation passage for evacuating the hand treatment space is preferably connected to the housing. This substantially prevents the atmosphere of the hand treatment space from flowing out of the hand treatment space, thereby preventing the substrate from being adversely affected by the hand cleaning process. Since the atmosphere of the hand treatment space can be properly controlled, the cleanliness of the hand can be improved.

According to further another embodiment of the present invention, the hand cleaning unit includes a cleaning liquid supply unit which supplies a cleaning liquid to the hand inserted into the hand treatment space, and a liquid drain for draining a liquid from the hand treatment space is connected to the housing. With this arrangement, the hand can be cleaned with the cleaning liquid, so that the hand cleaning process can be efficiently performed to improve the cleanliness of the hand. Since the liquid is drained from the hand treatment space through the liquid drain, contaminants are unlikely to accumulate in the hand treatment space. The cleaning liquid may be a chemical liquid or deionized water, or may contain both a chemical liquid and deionized water.

The cleaning liquid supply unit preferably includes a cleaning liquid nozzle disposed in the hand treatment space so as to correspond in position to a substrate contact portion of the hand. The contaminants are liable to heavily accumulate around the substrate contact portion of the hand at which the hand contacts the substrate. With the cleaning liquid nozzle being located as corresponding in position to the substrate contact portion, therefore, the substrate contact portion of the hand can be intensively cleaned. Thus, the hand cleaning process can be efficiently performed.

According to still another embodiment of the present invention, the substrate treatment apparatus further includes a drying accelerating agent supply unit which supplies a drying accelerating agent (in a liquid or gas form) to the hand inserted into the hand treatment space. With this arrangement, the hand can be dried in a short period of time by the supply of the drying accelerating agent. Therefore, the hand can be rapidly dried after the hand is cleaned with the cleaning liquid. This makes it possible to reduce a period during which the hand is unavailable for holding the substrate after the hand cleaning process, minimizing the influence of the hand cleaning process on the substrate transportation.

The hand cleaning unit preferably includes a UV lamp which irradiates the hand with ultraviolet radiation. With this arrangement, foreign matter (particularly, organic substances) can be removed from the hand by decomposition thereof.

The foregoing and other objects, features and effects of the present invention will become more apparent from the following detailed description of the preferred embodiments with reference to the attached drawings.

BRIEF DESCRIPTION OF THE DRAWINGS

FIG. 2A is a schematic perspective view for explaining an exemplary construction of a hand cleaning unit, particularly illustrating the hand cleaning unit with its internal structure seen through.

FIG. 2B is a schematic perspective view for explaining the exemplary construction of the hand cleaning unit, particularly illustrating the hand cleaning unit with its internal structure seen through.

DETAILED DESCRIPTION OF THE PREFERRED EMBODIMENTS

Figure 1A:
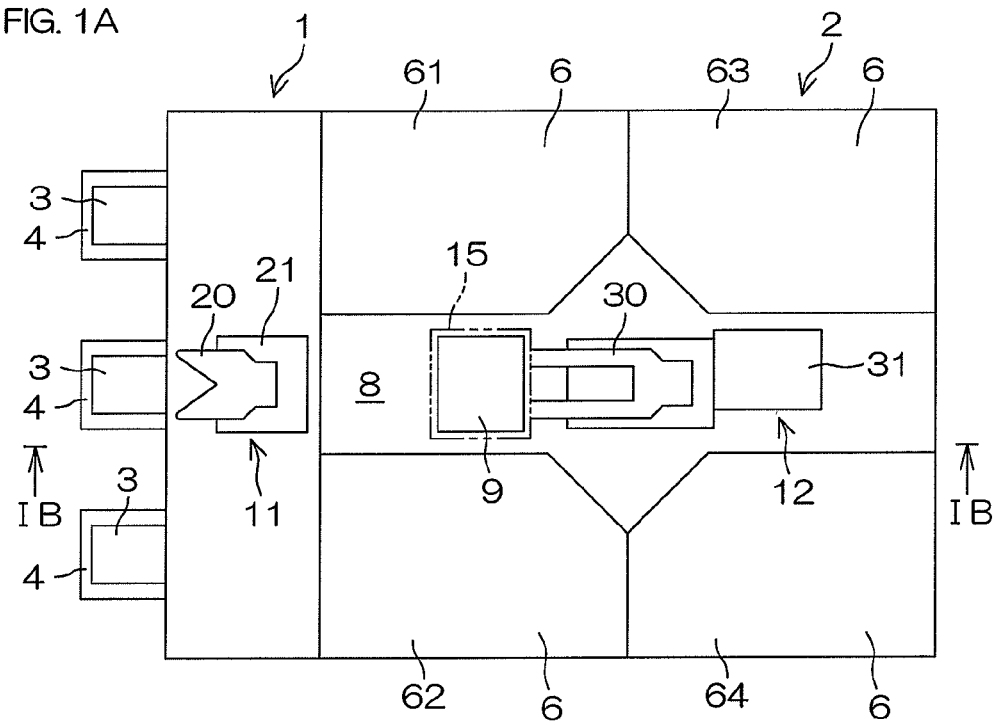
FIG. 1A is a schematic plan view for explaining a layout in a substrate treatment apparatus according to a first embodiment of the present invention.
Figure 1B:
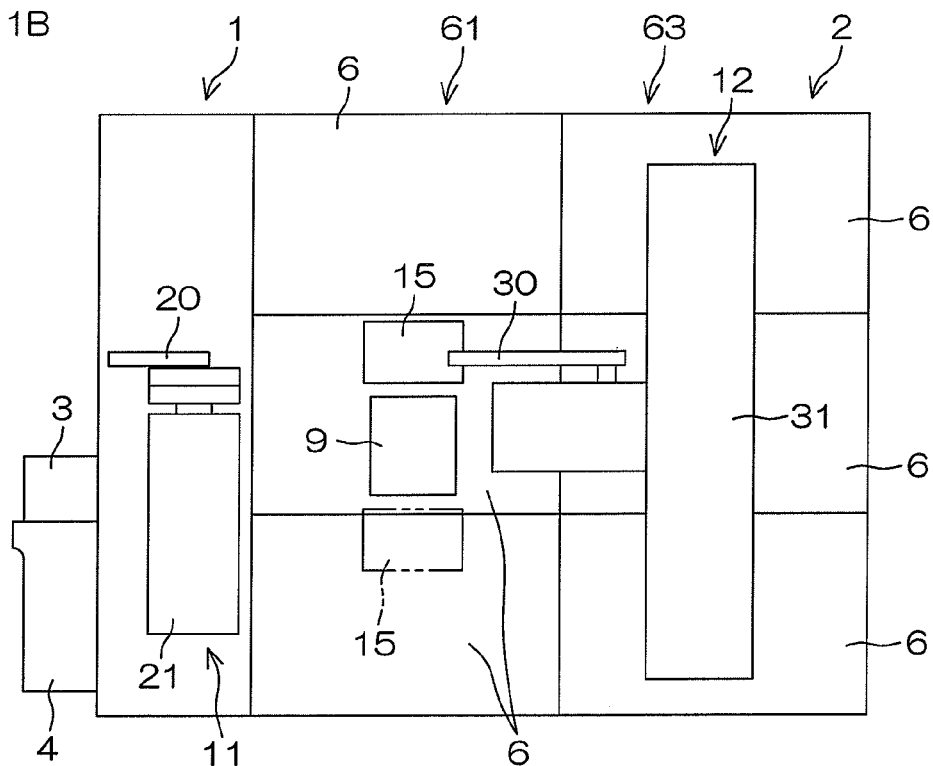
FIG. 1B is a schematic vertical sectional view of the substrate treatment apparatus taken along a section line IB-IB in FIG. 1A.

FIG. 1A is a schematic plan view for explaining a layout in a substrate treatment apparatus according to a first embodiment of the present invention, and FIG. 1B is a schematic vertical sectional view of the substrate treatment apparatus taken along a section line IB-IB in FIG. 1A.

The substrate treatment apparatus is of a single substrate treatment type which is adapted to treat a single semiconductor substrate or other substrate at a time, and includes an indexer section 1 and a process section 2.

The indexer section 1 includes substrate container retaining portions 4 which each retain a substrate container 3, and an indexer robot 11. The substrate container 3 is configured, for example, to horizontally hold a plurality of substrates in vertically spaced relation. The substrate container retaining portions 4 are disposed, for example, in juxtaposition, and are each capable of retaining a single substrate container 3.

On the other hand, the process section 2 includes a main transport robot 12, and a plurality of treatment units 6 which are disposed around the main transport robot 12 as seen in plan. The treatment units 6 may include a unit adapted to treat a substrate by supplying a treatment liquid (a chemical liquid or a rinse liquid) to the substrate, a unit adapted to treat a substrate by supplying a treatment gas to the substrate, and/or a unit adapted to treat a substrate by irradiating the substrate with electromagnetic radiation such as ultraviolet radiation. In this embodiment, twelve treatment units 6 are provided in the process section 2. The twelve treatment units 6 are divided into four treatment unit groups 61 to 64, which are located at respective four sites around the main transport robot 12 as seen in plan and each include three treatment units 6 vertically stacked one on another. That is, the treatment units are arranged in a three-level unit configuration. More specifically, two 61, 62 of the treatment unit groups are located adjacent the indexer section 1, and a transport passage 8 is defined between these two treatment unit groups 61 and 62 by the treatment unit groups 61, 62. The other two treatment unit groups 63, 64 are disposed adjacent the treatment unit groups 61, 62 on an opposite side from the indexer section 1. A space similar to the transport passage 8 is defined between these two treatment unit groups 63 and 64 by the treatment unit groups 63, 64. A transfer unit 9 capable of temporarily holding an untreated substrate and a treated substrate is disposed in the transport passage 8.

The indexer robot 11 is capable of transporting a substrate into and out of any one of the substrate containers 3 retained on the substrate container retaining portions 4. Further, the indexer robot 11 is capable of transferring the substrate with respect to the transfer unit 9. That is, the indexer robot 11 is operative to transfer an untreated substrate to the transfer unit 9, and receive a treated substrate from the transfer unit 9. The indexer robot 11 has a hand 20 (hereinafter referred to as "indexer hand 20") capable of holding the substrate, and a hand drive mechanism 21 which drives the indexer hand 20. The hand drive mechanism 21 includes, for example, a rotative drive mechanism which rotates the indexer hand 20 about a vertical axis, a vertical drive mechanism which vertically moves up and down the indexer hand 20, and a horizontal drive mechanism which horizontally moves back and forth the indexer hand 20. With this arrangement, the indexer robot 11 moves the indexer hand 20 into opposed relation to any one of the substrate containers 3 and the transfer unit 9, and advances and retracts the indexer hand 20 into/from any one of the substrate containers 3 and the transfer unit 9. The indexer robot 11 transfers the substrate with respect to any one of these transport destinations by moving up and down the indexer hand 20.

The main transport robot 12 performs a loading operation for loading an untreated substrate into any one of the treatment units 6 and an unloading operation for unloading a treated substrate from any one of the treatment units 6. The main transport robot 12 is capable of transferring a substrate with respect to the transfer unit 9. That is, the main transport robot 12 is operative to receive an untreated substrate from the transfer unit 9, and transfer a treated substrate to the transfer unit 9. The main transport robot 12 has a hand 30 (hereinafter referred to as "main transport hand 30") capable of holding the substrate, and a hand drive mechanism 31 which drives the main transport hand 30. The hand drive mechanism 31 includes, for example, a rotative drive mechanism which rotates the main transport hand 30 about a vertical axis, a vertical drive mechanism which vertically moves up and down the main transport hand 30, and a horizontal drive mechanism which horizontally moves back and forth the main transport hand 30. With this arrangement, the main transport robot 12 moves the main transport hand 30 into opposed relation to any one of the treatment units 6 and the transfer unit 9, and advances and retracts the main transport hand 30 into/from any one of the treatment units 6 and the transfer unit 9. The main transport robot 12 transfers the substrate with respect to any one of these transport destinations by moving up and down the main transport hand 30.

A hand cleaning unit 15 (indicated by a phantom line in FIG. 1A) is disposed above the transfer unit 9. The hand cleaning unit 15 is located in the transport passage 8 so as to at least partly overlap the transfer unit 9 as seen in plan in this embodiment. The indexer robot 11 causes the indexer hand 20 to access the hand cleaning unit 15. Further, the main transport robot 12 causes the main transport hand 30 to access the hand cleaning unit 15. In other words, the hand cleaning unit 15 is located within a vertically movable height range of the indexer hand 20 and within a vertically movable height range of the main transport hand 30 in the transport passage 8 so as to be accessible from the indexer robot 11 and the main transport robot 12. The hand cleaning unit 15 is adapted to clean the indexer hand 20 and the main transport hand 30.

The substrate treatment apparatus typically operates in the following manner.

The indexer robot 11 transports a single untreated substrate into the transfer unit 9 from any one of the substrate containers 3 retained on the substrate container retaining portions 4. The main transport robot 12 transports the untreated substrate from the transfer unit 9 into any one of the treatment units 6. Further, the main transport robot 12 takes a treated substrate out of the treatment unit 6, and transfers the treated substrate to the transfer unit 9. The indexer robot 11 transports the treated substrate from the transfer unit 9 into any one of the substrate containers 3 retained on the substrate container retaining portions 4.

The indexer robot 11 may have a pair of indexer hands 20, and may be operative to transfer an untreated substrate into the transfer unit 9 by one of the indexer hands 20 and transport a treated substrate from the transfer unit 9 by the other indexer hand 20. The main transport robot 12 may have a pair of main transport hands 30, and may be operative to transport a treated substrate from any one of the treatment units 6 by one of the main transport hands 30 and transport an untreated substrate into that treatment unit 6 by the other main transport hand 30. That is, the main transport robot 12 may be operative to replace the treated substrate with the untreated substrate in any one of the treatment units 6.

Figure 2B:
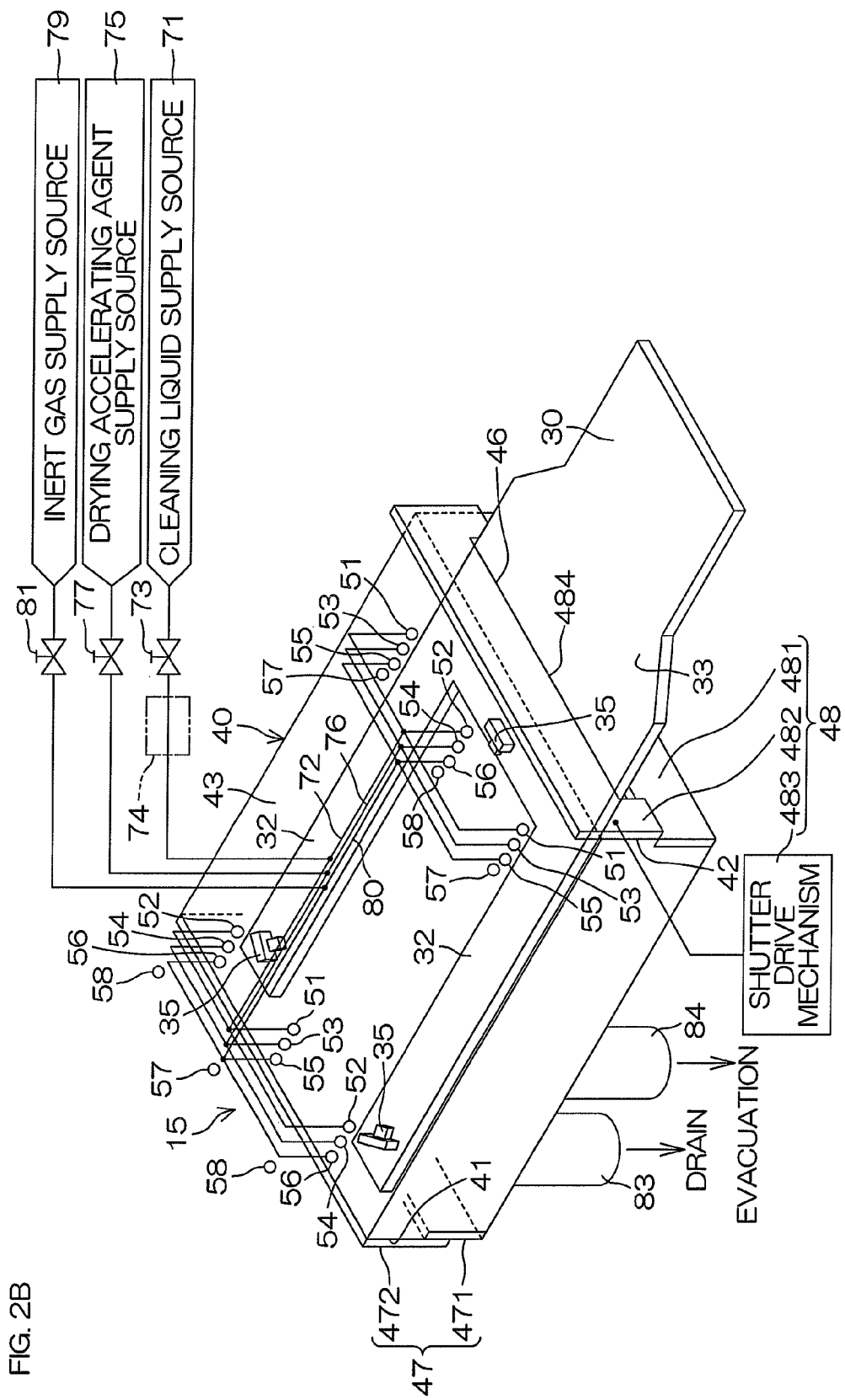

FIGS. 2A and 2B are schematic perspective views for explaining an exemplary construction of the hand cleaning unit 15, particularly illustrating the hand cleaning unit 15 with its internal structure seen through. FIG. 2A illustrates the hand cleaning unit 15 as seen from the side of the indexer robot 11, and FIG. 2B illustrates the hand cleaning unit 15 as seen from the side of the main transport robot 12.

The hand cleaning unit 15 includes a housing 40 defining a hand treatment space 43 in which the hands 20, 30 are accommodated and cleaned. The housing 40 has, for example, a flat rectangular box shape, and is disposed with its opposite end faces 41, 42 opposed to the indexer robot 11 and the main transport robot 12, respectively. A first end face 41 located on the side of the indexer robot 11 has a first hand receiving port 45 through which the indexer hand 20 is received, and a first shutter mechanism 47 for opening and closing the first hand receiving port 45 is disposed adjacent the first end face 41. Similarly, a second end face 42 located on the side of the main transport robot 12 has a second hand receiving port 46 through which the main transport hand 30 is received, and a second shutter mechanism 48 for opening and closing the second hand receiving port 46 is disposed adjacent the second end face 42. The first hand receiving port 45 and the second hand receiving port 46 may be provided at the same height level, or at different height levels. With the first and second hand receiving ports 45, 46 provided at the different height levels, the indexer hand 20 and the main transport hand 30 are structurally prevented from interfering with each other even if the indexer robot 11 and the main transport robot 12 simultaneously insert their hands 20, 30 into the hand treatment space 43.

The indexer hand 20 is configured such that a pair of finger portions 22 extending parallel to each other in a horizontal plane are connected to each other at a proximal portion 23. The first hand receiving port 45 has a slot shape extending horizontally so as to fit the structure of the indexer hand 20. Substrate guides 25 (three substrate guides 25 as an exemplary substrate contact portion) which hold a peripheral edge portion of a lower surface of the substrate and restrict horizontal movement of the substrate are disposed on distal end portions of the finger portions 22 and a front edge middle portion of the proximal portion 23 defined with respect to a widthwise direction (perpendicular to the lengths of the finger portions 22).

The first shutter mechanism 47 includes, for example, a stationary shutter plate 471 which covers a vertically defined portion (e.g., a vertically defined half portion) of the first end face 41, a movable shutter plate 472 which covers the other portion of the first end face 41 and partly overlaps the stationary shutter plate 471, and a shutter drive mechanism 473 which drives the movable shutter plate 472. The stationary shutter plate 471 and the movable shutter plate 472 each have, for example, a rectangular shape. Either one of the stationary shutter plate 471 and the movable shutter plate 472 (e.g., the movable shutter plate 472 in FIG. 2A) has an elongated rectangular recess 474, which is recessed from an edge of a portion of the one shutter plate overlapping the other shutter plate (i.e., the stationary shutter plate 471 in FIG. 2A). The shutter drive mechanism 473 vertically slidably drives the movable shutter plate 472 along the first end face 42. When the movable shutter plate 472 is driven to be moved away from the stationary shutter plate 471 (in a direction such as to reduce the area of the portion of the movable shutter plate 472 overlapping the stationary shutter plate 471) to reach an open position, the first hand receiving port 45 is defined between the recess 474 and an edge of the other shutter plate (i.e., the stationary shutter plate 471 in FIG. 2A) opposed to the recess. When the movable shutter plate 472 is driven to be moved toward the stationary shutter plate 471 (in a direction such as to increase the area of the portion of the movable shutter plate 472 overlapping the stationary shutter plate 471) to reach a closed position, the recess 474 is completely covered with the other shutter plate (i.e., the stationary shutter plate 471 in FIG. 2A), whereby the first hand receiving port 45 is closed. The recess which defines the first hand receiving port 45 with the movable shutter plate 472 located at the open position may include recesses respectively provided in the stationary shutter plate 471 and the movable shutter plate 472. The shutter plates 471, 472 provided in pair may be movable shutter plates which are moved toward and away from each other.

The main transport hand 30 is configured such that a pair of finger portions 32 extending parallel to each other in a horizontal plane are connected to each other at a proximal portion 33. The second hand receiving port 46 has a slot shape extending horizontally so as to fit the structure of the main transport hand 30. Substrate guides 35 (three substrate guides 35 as an exemplary substrate contact portion) which hold a peripheral edge portion of a lower surface of the substrate and restrict horizontal movement of the substrate are disposed on distal end portions of the finger portions 32 and a front edge middle portion of the proximal portion 33 defined with respect to a widthwise direction (perpendicular to the lengths of the finger portions 32).

The second shutter mechanism 48 includes, for example, a stationary shutter plate 481 which covers a vertically defined portion (e.g., a vertically defined half portion) of the second end face 42, a movable shutter plate 482 which covers the other portion of the second end face 42 and partly overlaps the stationary shutter plate 481, and a shutter drive mechanism 483 which drives the movable shutter plate 482. The stationary shutter plate 481 and the movable shutter plate 482 each have, for example, a rectangular shape. Either one of the stationary shutter plate 481 and the movable shutter plate 482 (e.g., the movable shutter plate 482 in FIG. 2B) has an elongated rectangular recess 484, which is recessed from an edge of a portion of the one shutter plate overlapping the other shutter plate (i.e., the stationary shutter plate 481 in FIG. 2B).

The shutter drive mechanism 483 vertically slidably drives the movable shutter plate 482 along the second end face 42. When the movable shutter plate 482 is driven to be moved away from the stationary shutter plate 481 (in a direction such as to reduce the area of the portion of the movable shutter plate 482 overlapping the stationary shutter plate 481) to reach an open position, the second hand receiving port 46 is defined between the recess 484 and an edge of the other shutter plate (i.e., the stationary shutter plate 481 in FIG. 2B) opposed to the recess. When the movable shutter plate 482 is driven to be moved toward the stationary shutter plate 482 (in a direction such as to increase the area of the portion of the movable shutter plate 482 overlapping the stationary shutter plate 481) to reach a closed position, the recess 484 is completely covered with the other shutter plate (i.e., the stationary shutter plate 481 in FIG. 2B), whereby the secondhand receiving port 46 is closed. The recess which defines the second hand receiving port 46 with the movable shutter plate 482 located at the open position may be provided both in the stationary shutter plate 481 and the movable shutter plate 482. The shutter plates 481, 482 provided in pair may be movable shutter plates which are moved toward and away from each other.

Cleaning liquid nozzles 51, 52, drying accelerating agent nozzles 53, 54, inert gas nozzles 55, 56 and UV lamps 57, 58 are disposed in the hand treatment space 43.

The cleaning liquid nozzles 51, 52 include three cleaning liquid nozzles 51, 52 disposed adjacent the first end face 41, and three cleaning liquid nozzles 51, 52 disposed adjacent the second end face 42. A middle one 51 of the three cleaning liquid nozzles disposed adjacent the first end face 41 corresponds in position to the substrate guide 25 disposed at the proximal portion 23 of the indexer hand 20 inserted in the hand treatment space 43. The other two 52 of the three cleaning liquid nozzles disposed on opposite sides adjacent the first end face 41 correspond in position to the respective substrate guides 35 provided in pair at the distal end portions of the finger portions 32 of the main transport hand 30 inserted in the hand treatment space 43. On the other hand, a middle one 52 of the three cleaning liquid nozzles disposed adjacent the second end face 42 corresponds in position to the substrate guide 35 disposed at the proximal portion 33 of the main transport hand 30 inserted in the hand treatment space 43. The other two 52 of the three cleaning liquid nozzles disposed on opposite sides adjacent to the second end face 42 correspond in position to the respective substrate guides 25 provided in pair at the distal end portions of the finger portions 22 of the indexer hand 20 inserted in the hand treatment space 43. That is, the positions of the three cleaning liquid nozzles 51 correspond to the positions of the respective substrate guides 25 of the indexer hand 20, and are adapted to spout a cleaning liquid toward the corresponding substrate guides 25. Similarly, the three cleaning liquid nozzles 52, whose positions correspond to the respective positions of the substrate guides 35 of the main transport hand 30, are adapted to spout the cleaning liquid toward the corresponding substrate guides 35.

The drying accelerating agent nozzles 53, 54, the inert gas nozzles 55, 56 and the UV lamps 57, 58 are disposed in the similar arrangement as the cleaning liquid nozzles 51, 52. That is, the drying accelerating agent nozzles 53, 54 include three drying accelerating agent nozzles 53 which correspond in position to the substrate guides 25 of the indexer hand 20 and are adapted to spout a drying accelerating agent toward the corresponding substrate guides 25, and three drying accelerating agent nozzles 54 which correspond in position to the substrate guides 35 of the main transport hand 30 and are adapted to spout the drying accelerating agent toward the corresponding substrate guides 35. The inert gas nozzles 55, 56 include three inert gas nozzles 55 which correspond in position to the substrate guides 25 of the indexer hand 20 and are adapted to spout an inert gas toward the corresponding substrate guides 25, and three inert gas nozzles 56 which correspond in position to the substrate guides 35 of the main transport hand 30 and are adapted to spout the inert gas toward the corresponding substrate guides 35. The UV lamps 57, 58 include three UV lamps 57 which correspond in position to the substrate guides 25 of the indexer hand 20 and are adapted to emit ultraviolet radiation toward the corresponding substrate guides 25, and three UV lamps 58 which correspond in position to the substrate guides 35 of the main transport hand 30 and are adapted to emit the ultraviolet radiation toward the corresponding substrate guides 35.

Examples of the cleaning liquid include deionized water, hot deionized water (deionized water having a temperature higher than an ordinary temperature) and carbonated water. Depending on the type of expected contaminants, a chemical liquid may be used in combination with water. Examples of the drying accelerating agent include alcohols typified by IPA (isopropyl alcohol) and other volatile liquids. Examples of the inert gas include clean dry air and nitrogen gas. The ultraviolet radiation is utilized for decomposing organic contaminants adhering to the hands 20, 30 (particularly, the substrate guides 25, 35).

The cleaning liquid is supplied to the cleaning liquid nozzles 51, 52 from a cleaning liquid supply source 71 through a cleaning liquid supply passage 72. A cleaning liquid valve 73 is provided in the cleaning liquid supply passage 72. The spouting of the cleaning liquid from the cleaning liquid nozzles 51, 52 is turned on and off by opening and closing the cleaning liquid valve 73. Different cleaning liquid supply passages may be provided for supplying the cleaning liquid to the cleaning liquid nozzles 51 for the indexer hand 20 and to the cleaning liquid nozzles 52 for the main transport hand 30. In this case, cleaning liquid valves 73 are provided in the respective cleaning liquid supply passages, so that the on and off of the spouting of the cleaning liquid from the cleaning liquid nozzles 51 and the on and off of the spouting of the cleaning liquid from the cleaning liquid nozzles 52 can be individually controlled.

The cleaning liquid nozzles 51, 52 may each be a straight nozzle which continuously linearly spouts the cleaning liquid, or a shower nozzle which showers the cleaning liquid. An ultrasonic vibration unit 74 (indicated by two-dot-and-dash lines in FIGS. 2A and 2B) may be provided in the cleaning liquid supply passage 72 to ultrasonically vibrate the cleaning liquid flowing through the cleaning liquid supply passage 72, and the ultrasonically vibrated cleaning liquid may be spouted from the cleaning liquid nozzles 51, 52. Ultrasonic nozzles each including an ultrasonic oscillator may be used as the cleaning liquid nozzles 51, 52 to achieve the same effects.

The drying accelerating agent is supplied to the drying accelerating agent nozzles 53, 54 from a drying accelerating agent supply source 75 through a drying accelerating agent supply passage 76. A drying accelerating agent valve 77 is provided in the drying accelerating agent supply passage 76. The spouting of the drying accelerating agent from the drying accelerating agent nozzles 53, 54 is turned on and off by opening and closing the drying accelerating agent valve 77. Different drying accelerating agent passages may be provided for supplying the drying accelerating agent to the drying accelerating agent nozzles 53 for the indexer hand 20 and to the drying accelerating agent nozzles 54 for the main transport hand 30. In this case, drying accelerating agent valves 77 are provided in the respective drying accelerating agent supply passages, so that the on and off of the spouting of the drying accelerating agent from the drying accelerating agent nozzles 53 and the on and off of the spouting of the drying accelerating agent from the drying accelerating agent nozzles 54 can be individually controlled.

The inert gas is supplied to the inert gas nozzles 55, 56 from an inert gas supply source 79 through an inert gas supply passage 80. An inert gas valve 81 is provided in the inert gas supply passage 80. The spouting of the inert gas from the inert gas nozzles 55, 56 is turned on and off by opening and closing the inert gas valve 81. Different inert gas passages may be provided for supplying the inert gas to the inert gas nozzles 55 for the indexer hand 20 and to the inert gas nozzles 56 for the main transport hand 30. In this case, inert gas valves 81 are provided in the respective inert gas supply passages, so that the on and off of the spouting of the inert gas from the inert gas nozzles 55 and the on and off of the spouting of the inert gas from the inert gas nozzles 56 can be individually controlled.

The inert gas nozzles 55, 56 may be positioned so that the inert gas can be spouted toward the substrate guides 25, 35 perpendicularly to the indexer hand 20 and the main transport hand 30. Alternatively, the inert gas nozzles 55, 56 may be positioned so that the inert gas can be spouted toward the substrate guides 25, 35 at an angle with respect to the indexer hand 20 and the main transport hand 30.

The UV lamps 57, 58 are supplied with power from a power source line not shown. Both the UV lamps 57, 58, respectively corresponding to the indexer hand 20 and the main transport hand 30, may be simultaneously turned on or turned off. On the other hand, the circuit configuration may be arranged so that the UV lamps 57, 58 can be individually turned on and off.

A liquid drain pipe 83 and an evacuation pipe 84 are connected to a bottom surface of the housing 40. The liquid drain pipe 83 is connected, for example, to a plant drain system. The evacuation pipe 84 is connected, for example, to a plant evacuation system. Therefore, the cleaning liquid or the like spouted in the hand treatment space 43 is drained through the liquid drain pipe 83. Further, the hand treatment space 43 is evacuated through the evacuation pipe 84. This substantially prevents the atmosphere in the hand treatment space 43 from flowing out of the housing 40, thereby substantially preventing the substrate from being affected by the cleaning of the hands 20, 30.

Figure 3:
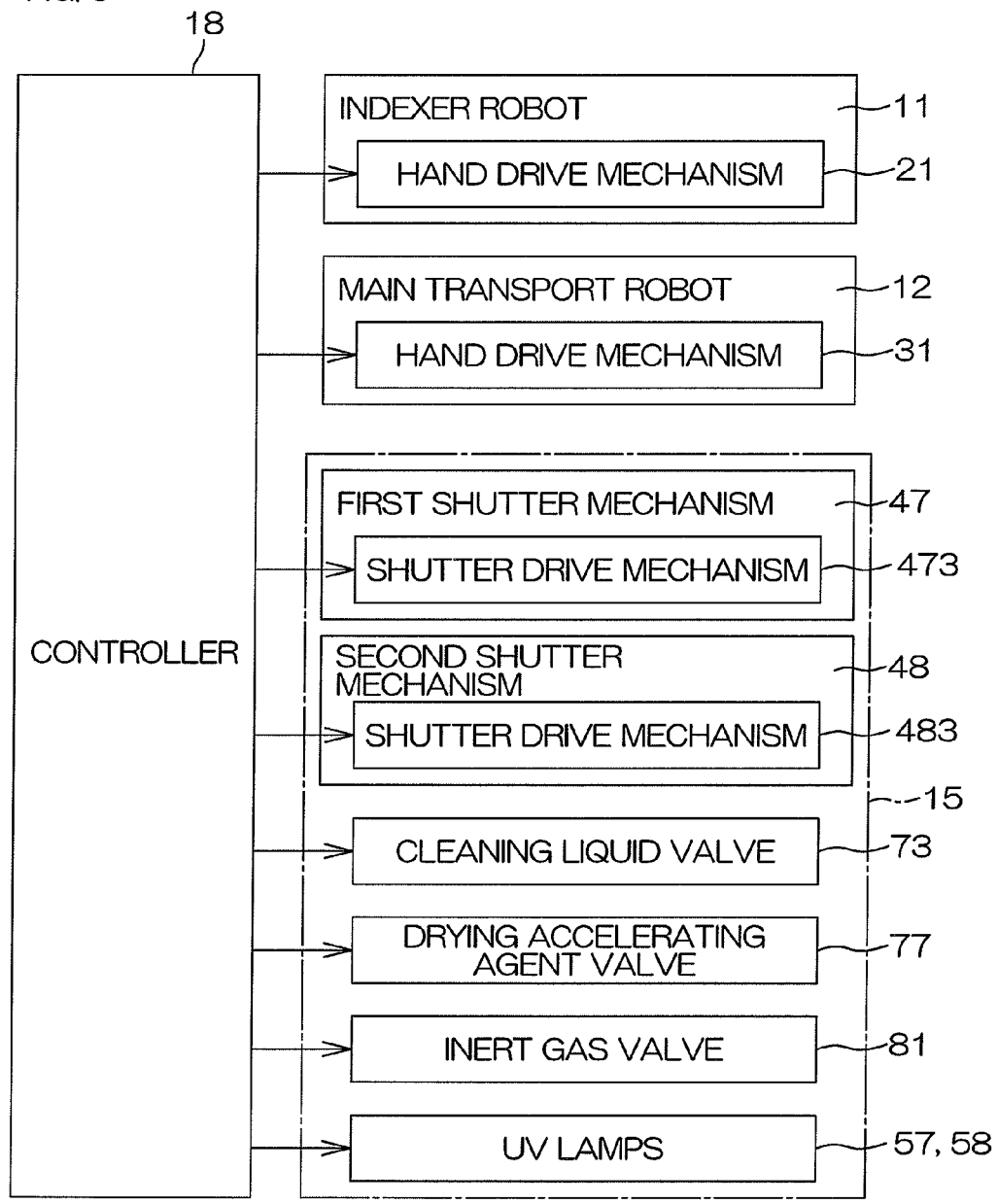
FIG. 3 is a block diagram for explaining the electrical construction of the substrate treatment apparatus.

FIG. 3 is a block diagram for explaining the electrical construction of the substrate treatment apparatus. The substrate treatment apparatus includes a controller 18 which controls the components of the apparatus. The controller 18 controls the operations of the treatment units 6, the indexer robot 11 (particularly, the hand drive mechanism 21), the main transport robot 12 (particularly, the hand drive mechanism 31), the hand cleaning unit 15 and the like. For the control of the hand cleaning unit 15, the controller 18 is configured (programmed) so as to perform a hand cleaning process by controlling the operations of the first and second shutter mechanisms 47, 48 (particularly, the shutter drive mechanisms 473, 483), the opening and closing of the valves 73, 77, 81, and the on and off of the UV lamps 57, 58.

The hand cleaning process includes, for example, a cleaning step of cleaning the hand 20 or 30 (particularly, the substrate guides 25 or 35) by supplying the cleaning liquid from the cleaning liquid nozzles 51 or 52, a drying accelerating step of replacing the cleaning liquid with the drying accelerating agent by supplying the drying accelerating agent from the drying accelerating agent nozzles 53 or 54, a drying step of drying the hand 20 or 30 (particularly, the substrate guides 25 or 35) by supplying the inert gas, and a UV irradiation step of decomposing organic contaminants adhering to the hand 20 or 30 (particularly, the substrate guides 25 or 35) by emitting ultraviolet radiation from the UV lamps 57 or 58. The UV irradiation step may be omitted depending on the type of the contaminants. In the hand treatment space 43, the contaminants are thus removed from the hand 20 or 30, which is in turn dried.

More specifically, when the indexer hand 20 is to be cleaned, the controller 18 controls the hand drive mechanism 21 of the indexer robot 11 to bring the indexer hand 20 into opposed relation to the first end face 41 of the hand cleaning unit 15. The controller 18 drives the shutter drive mechanism 473 of the first shutter mechanism 47 to move the movable shutter plate 472 to the open position, whereby the first hand receiving port 45 is opened. In this state, the controller 18 controls the hand drive mechanism 21 to advance the indexer hand 20 to a hand cleaning position in the hand treatment space 43 through the first hand receiving port 45. With the indexer hand 20 located at the hand cleaning position, all the substrate guides 25 of the indexer hand 20 can be located within the hand treatment space 43 as corresponding in position to the cleaning liquid nozzles 51, the drying accelerating agent nozzles 53, the inert gas nozzles 55 and the UV lamps 57, and can be treated with the use of the cleaning liquid nozzles 51, the drying accelerating agent nozzles 53, the inert gas nozzles 55 and the UV lamps 57. In this state, the controller 18 performs the hand cleaning process described above. Thus, the indexer hand 20 is cleaned and dried. Upon completion of the hand cleaning process, the controller 18 controls the hand drive mechanism 21 of the indexer robot 11 to retract the indexer hand 20 from the hand treatment space 43 through the first hand receiving port 45. Thereafter, the controller 18 drives the shutter drive mechanism 473 of the first shutter mechanism 47 to move the movable shutter plate 472 to the closed position, whereby the first hand receiving port 45 is closed.

During the hand cleaning process, the controller 18 may control the hand drive mechanism 21 so as to reciprocally move the indexer hand 20 in an advancing direction in which the indexer hand 20 is advanced into the hand cleaning unit 15 and in a retracting direction in which the indexer hand 20 is retracted from the hand cleaning unit 15, whereby the position of the indexer hand 20 is shifted in the hand treatment space 43. Thus, the cleaning liquid supplied from the respective cleaning liquid nozzles 51, the drying accelerating agent supplied from the respective drying accelerating agent nozzles 53, the inert gas supplied from the respective inert gas nozzles 55 and the ultraviolet radiation emitted from the respective UV lamps 57 can be more uniformly applied onto the indexer hand 20 (particularly, the substrate guides 25).

As described above, the indexer hand 20 may be retracted from the hand treatment space 43 after the completion of the hand cleaning process. The drying step of the hand cleaning process may be performed simultaneously with the retraction of the indexer hand 20 from the hand treatment space 43. At this time, the inert gas may be spouted at an angle with respect to the indexer hand 20 in a direction opposite from the indexer hand retracting direction. Thus, the liquid adhering to the indexer hand 20 can be efficiently removed.

Similarly, when the main transport hand 30 is to be cleaned, the controller 18 controls the hand drive mechanism 31 of the main transport robot 12 to bring the main transport hand 30 into opposed relation to the second end face 42 of the hand cleaning unit 15. The controller 18 drives the shutter drive mechanism 483 of the second shutter mechanism 48 to move the movable shutter plate 482 to the open position, whereby the second hand receiving port 46 is opened. In this state, the controller 18 controls the hand drive mechanism 31 to advance the main transport hand 30 to a hand cleaning position in the hand treatment space 43 through the second hand receiving port 46. With the main transport hand 30 located at the hand cleaning position, all the substrate guides 35 of the main transport hand 30 can be located within the hand treatment space 43 as corresponding in position to the cleaning liquid nozzles 52, the drying accelerating agent nozzles 54, the inert gas nozzles 56 and the UV lamps 58, and can be treated with the use of the cleaning liquid nozzles 52, the drying accelerating agent nozzles 54, the inert gas nozzles 56 and the UV lamps 58. In this state, the controller 18 performs the hand cleaning process described above. Thus, the main transport hand 30 is cleaned and dried. Upon completion of the hand cleaning process, the controller 18 controls the hand drive mechanism 31 of the main transport robot 12 to retract the main transport hand 30 from the hand treatment space 43 through the second hand receiving port 46. Thereafter, the controller 18 drives the shutter drive mechanism 483 of the second shutter mechanism 48 to move the movable shutter plate 482 to the closed position, whereby the second hand receiving port 46 is closed.

During the hand cleaning process, the controller 18 may control the hand drive mechanism 31 so as to reciprocally move the main transport hand 30 in an advancing direction in which the main transport hand 30 is advanced into the hand cleaning unit 15 and in a retracting direction in which the main transport hand 30 is retracted from the hand cleaning unit 15, whereby the position of the main transport hand 30 is shifted in the hand treatment space 43. Thus, the cleaning liquid supplied from the respective cleaning liquid nozzles 52, the drying accelerating agent supplied from the respective drying accelerating agent nozzles 54, the inert gas supplied from the respective inert gas nozzles 56 and the ultraviolet radiation emitted from the respective UV lamps 58 can be more uniformly applied onto the main transport hand 30 (particularly, the substrate guides 35).

As described above, the main transport hand 30 may be retracted from the hand treatment space 43 after the completion of the hand cleaning process. The drying step of the hand cleaning process may be performed simultaneously with the retraction of the main transport hand 30 from the hand treatment space 43. At this time, the inert gas may be spouted at an angle with respect to the main transport hand 30 in a direction opposite from the main transport hand retracting direction. Thus, the liquid adhering to the main transport hand 30 can be efficiently removed.

According to this embodiment, as described above, the hand cleaning unit 15 is disposed above the transfer unit 9 which is adapted to transfer the substrate between the indexer robot 11 and the main transport robot 12. Therefore, the transfer unit 9 and the hand cleaning unit 15 are located in three-dimensional relation. Thus, the hand cleaning unit 15 can be provided without any increase in the occupation area (footprint) of the substrate treatment apparatus, making it possible to clean the indexer hand 20 and the main transport hand 30 by the hand cleaning unit 15. This substantially prevents the transportation failures without increasing the footprint of the substrate treatment apparatus, so that the substrate treatment can be reliably performed.

The treatment units 6 are stacked at three levels to be disposed in three-dimensional relation, making it easy to provide a relatively large space above or below the transfer unit 9 in the transport passage 8. Therefore, the hand cleaning unit 15 can be easily provided in the transport passage 8.

Further, the hand cleaning unit 15 includes the housing 40 defining the hand treatment space 43 in which the indexer hand 20 and the main transport hand 30 are accommodated and treated. The first and second hand receiving ports 45, 46 can be opened and closed by the first and second shutter mechanisms 47, 48. Therefore, the hand treatment space 43 is substantially a closed space, in which the hands 20, 30 can be cleaned. This prevents the substrate from being affected by the hand cleaning process. When the hand cleaning process is not performed, the hand receiving ports 45, 46 can be closed, thereby substantially preventing leakage of the atmosphere of the hand treatment space 43. This more effectively prevents the substrate from being affected by the hand cleaning process.

The hand cleaning unit 15 has the first hand receiving port 45 directed toward the indexer robot 11, and the second hand receiving port 46 directed toward the main transport robot 12. This makes it possible to clean the indexer hand 20 and the main transport hand 30 in the common hand cleaning unit. Thus, the inside space of the substrate treatment apparatus can be more efficiently utilized to additionally provide the hand cleaning function.

In this embodiment, the cleaning liquid nozzles 51, 52, the drying accelerating agent nozzles 53, 54, the inert gas nozzles 55, 56 and the UV lamps 57, 58 correspond in position to the substrate guides 25, 35. This makes it possible to efficiently clean the substrate guides 25, 35 around which the contaminants are liable to accumulate, and to perform the drying step in a shorter period of time.

The supply of the drying accelerating agent from the drying accelerating agent nozzles 53, 54 makes it possible to dry the hands 20, 30 in a shorter period of time. Therefore, the hands 20, 30 can be dried immediately after the hands are cleaned with the cleaning liquid. This reduces a period during which the hands 20, 30 are unavailable for holding the substrate after the hand cleaning process can be reduced, minimizing the influence of the hand cleaning process on the substrate transportation.

Further, foreign matter (particularly, organic substances) on the hands 20, 30 can be decomposed to be removed from the hands 20, 30 by irradiating the hands 20, 30 with the ultraviolet radiation emitted from the UV lamps 57, 58. Thus, the hands 20, 30 can be more efficiently cleaned.

For example, the indexer hand 20 and/or the main transport hand 30 are cleaned at any of the following timings. These timings may be employed either alone or in combination for the cleaning of the indexer hand 20 and the main transport hand 30.

(1) Before/after Treatment of Lot

The indexer hand 20 and the main transport hand 30 may be cleaned after or before a plurality of substrates (e.g., 25 substrates) of a single lot are treated. Alternatively, the indexer hand 20 and the main transport hand 30 may be cleaned after or before substrates of a predetermined number of lots are treated.

(2) After Transportation or Treatment of Predetermined Number of Substrates

Transportation of a large number of substrates contributes to the risk for accumulation of contaminants on the substrate guides 25, 35, thereby causing transportation failures. Therefore, the number of substrates transported by the indexer robot 11 and/or the main transport robot 12 or the number of substrates treated by the substrate treatment apparatus may be counted and, when the counted number reaches a predetermined value, the indexer hand 20 and the main transport hand 30 may be cleaned.

(3) After Transportation of Each Substrate

The indexer hand 20 and the main transport hand 30 may be cleaned after transportation of each substrate.

(4) At Change in Type of Substrate Treatment

Where a first substrate treatment process is performed on one set of one or more substrates and then a second substrate treatment process is performed on another set of one or more substrates, the indexer hand 20 and the main transport hand 30 may be cleaned before the start of the second substrate treatment process.

(5) During Transportation Standby Period

When all the treatment units 6 are occupied for the substrate treatment, a transportation standby period occurs during which the indexer robot 11 and/or the main transport robot 12 are not allowed to transport a substrate. Even if not all the treatment units 6 are occupied for the substrate treatment, the transportation standby period sometimes occurs. Where a substrate treated by a first treatment unit 6 is transported into a second treatment unit 6 for another treatment (a so-called consecutive treatment process is performed), for example, the substrate cannot be transported into the second treatment unit 6 (even if no substrate treatment is performed in the second treatment unit 6) until the substrate treatment in the first treatment unit 6 is completed. Hence, there is a possibility that the transportation standby period occurs. This transportation standby period may be utilized for the cleaning of the indexer hand 20 and/or the main transport hand 30.

(6) At Start and End of Operation of Substrate Treatment Apparatus

The start of the operation of the substrate treatment apparatus herein means a time at which power supply to the substrate treatment apparatus is turned on to start the operation of the substrate treatment apparatus. The end of the operation of the substrate treatment apparatus herein means a time at which the power supply to the substrate treatment apparatus is turned off to end the operation of the substrate treatment apparatus.

As indicated by a phantom line in FIG. 1B, two or more hand cleaning units 15 may be provided. Where two hand cleaning units 15 are provided, for example, the two hand cleaning units 15 may be disposed above the transfer unit 9 or below the transfer unit 9. Alternatively, the two hand cleaning units 15 may be respectively disposed above and below the transfer unit 9. In FIG. 1B, the two hand cleaning units 15 are respectively disposed above and below the transfer unit 9 by way of example. With the provision of the two or more hand cleaning units 15, an indexer hand cleaning period for cleaning the indexer hand 20 and a main transport hand cleaning period for cleaning the main transport hand 30 may overlap each other. That is, there is no need to stagger the indexer hand cleaning period and the main transport hand cleaning period, obviating the need for adjustment of the hand cleaning periods. This makes it possible to properly clean the hands 20, 30, while suppressing the influence of the hand cleaning process on the substrate transportation.

Figure 4:
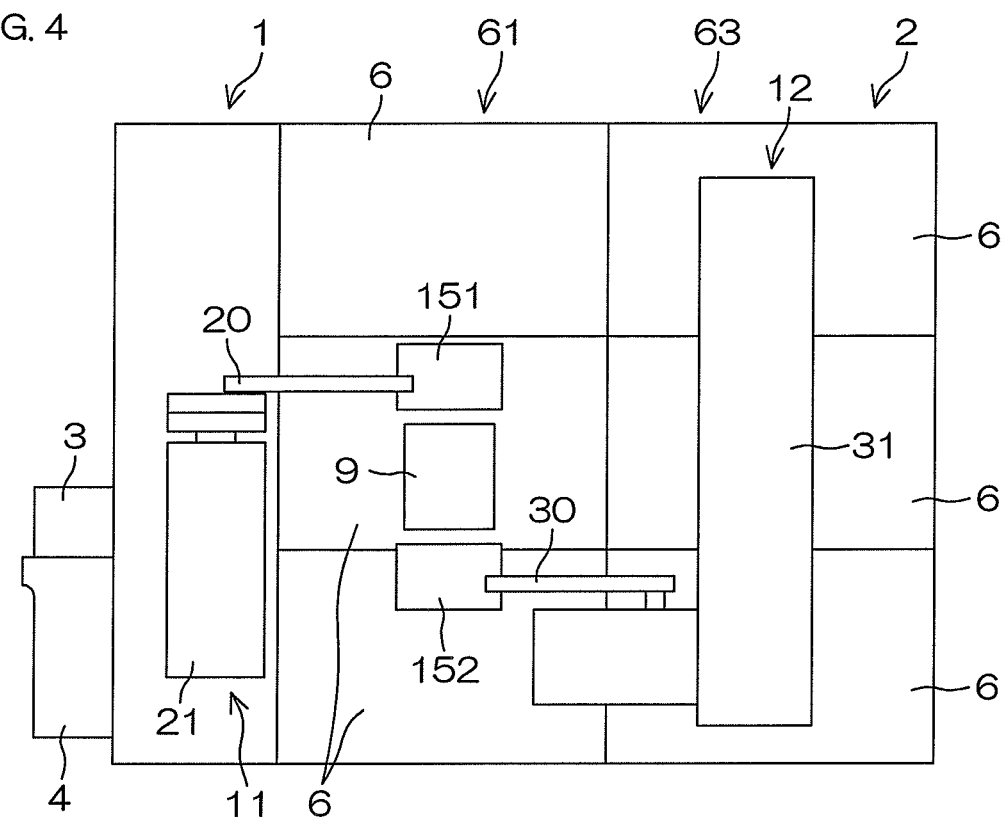
FIG. 4 is a schematic vertical sectional view of a substrate treatment apparatus according to a second embodiment of the present invention.

FIG. 4 is a schematic vertical sectional view of a substrate treatment apparatus according to a second embodiment of the present invention. In FIG. 4, components corresponding to those shown in FIG. 1B are designated by the same reference characters as in FIG. 1B. In this embodiment, a first hand cleaning unit 151 is disposed above the transfer unit 9, and a second hand cleaning unit 152 is disposed below the transfer unit 9. The first hand cleaning unit 151 is a cleaning unit for cleaning the indexer hand 20. The second hand cleaning unit 152 is a cleaning unit for cleaning the main transport hand 30. The vertical positional relationship between the first hand cleaning unit 151 and the second hand cleaning unit 152 may be inverted, so that the first hand cleaning unit 151 is disposed below the transfer unit 9 and the second hand cleaning unit 152 is disposed above the transfer unit 9.

Figure 5:
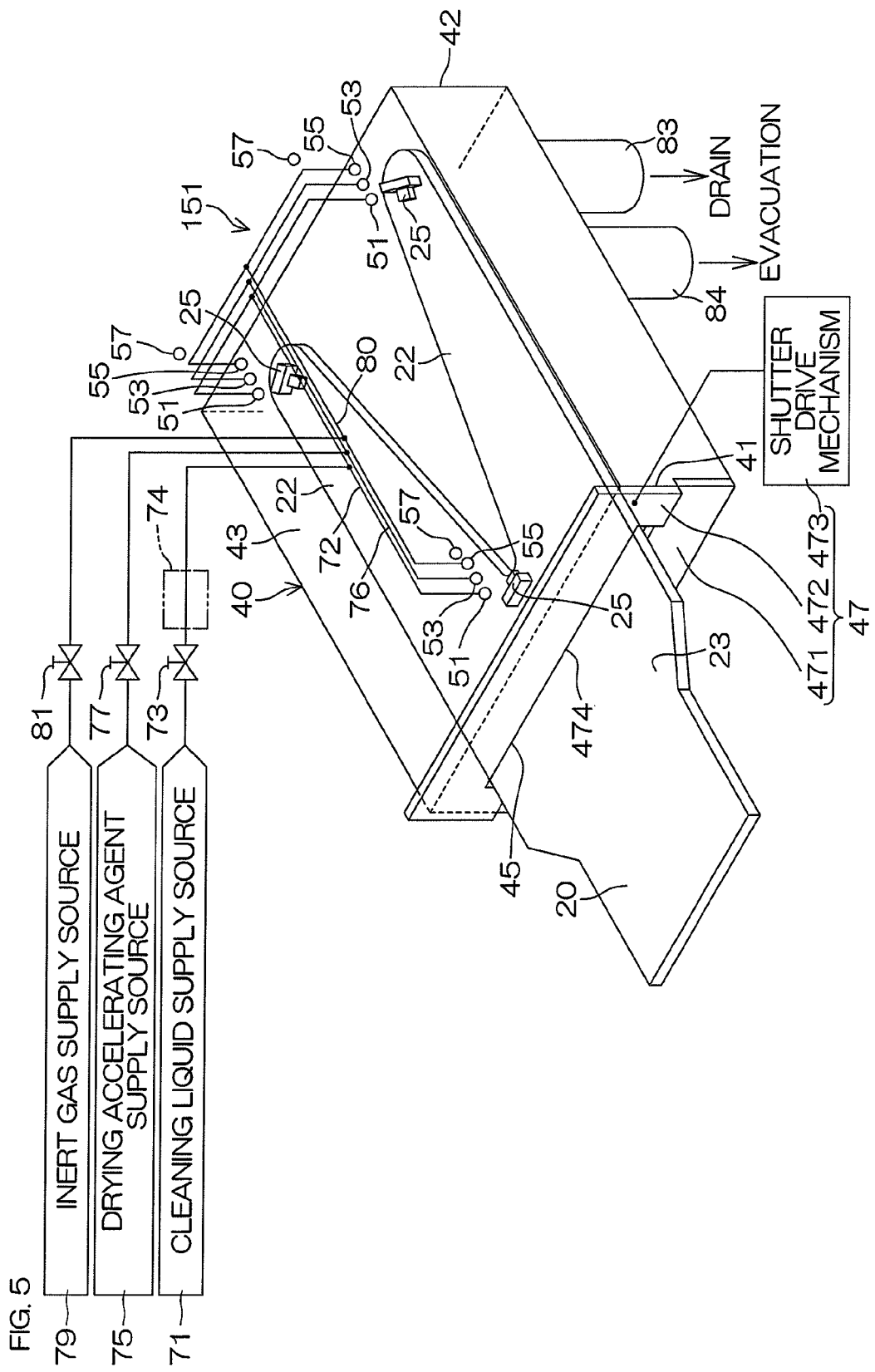
FIG. 5 is a schematic perspective view for explaining the construction of a first hand cleaning unit.

FIG. 5 is a schematic perspective view for explaining the construction of the first hand cleaning unit 151. In FIG. 5, components corresponding to those shown in FIG. 2A are designated by the same reference characters as in FIG. 2A. The first hand cleaning unit 151 includes only the arrangement for cleaning the indexer hand 20 with the arrangement for cleaning the main transport hand 30 being omitted from the hand cleaning unit 15 of the first embodiment. More specifically, the first hand cleaning unit 151 has substantially the same construction as the hand cleaning unit 15, except that the second shutter mechanism 48, the cleaning liquid nozzles 52, the drying accelerating agent nozzles 54, the inert gas nozzles 56 and the UV lamps 58 are omitted from the hand cleaning unit 15. That is, the first hand cleaning unit 151 includes a first shutter mechanism 47 provided on a first end face 41 thereof to be opposed to the indexer robot 11 for opening and closing a first hand receiving port 45. Further, cleaning liquid nozzles 51, drying accelerating agent nozzles 53, inert gas nozzles 55 and UV lamps 57 are disposed in a hand treatment space 43 as corresponding in position to the substrate guides 25 of the indexer hand 20.

Figure 6:
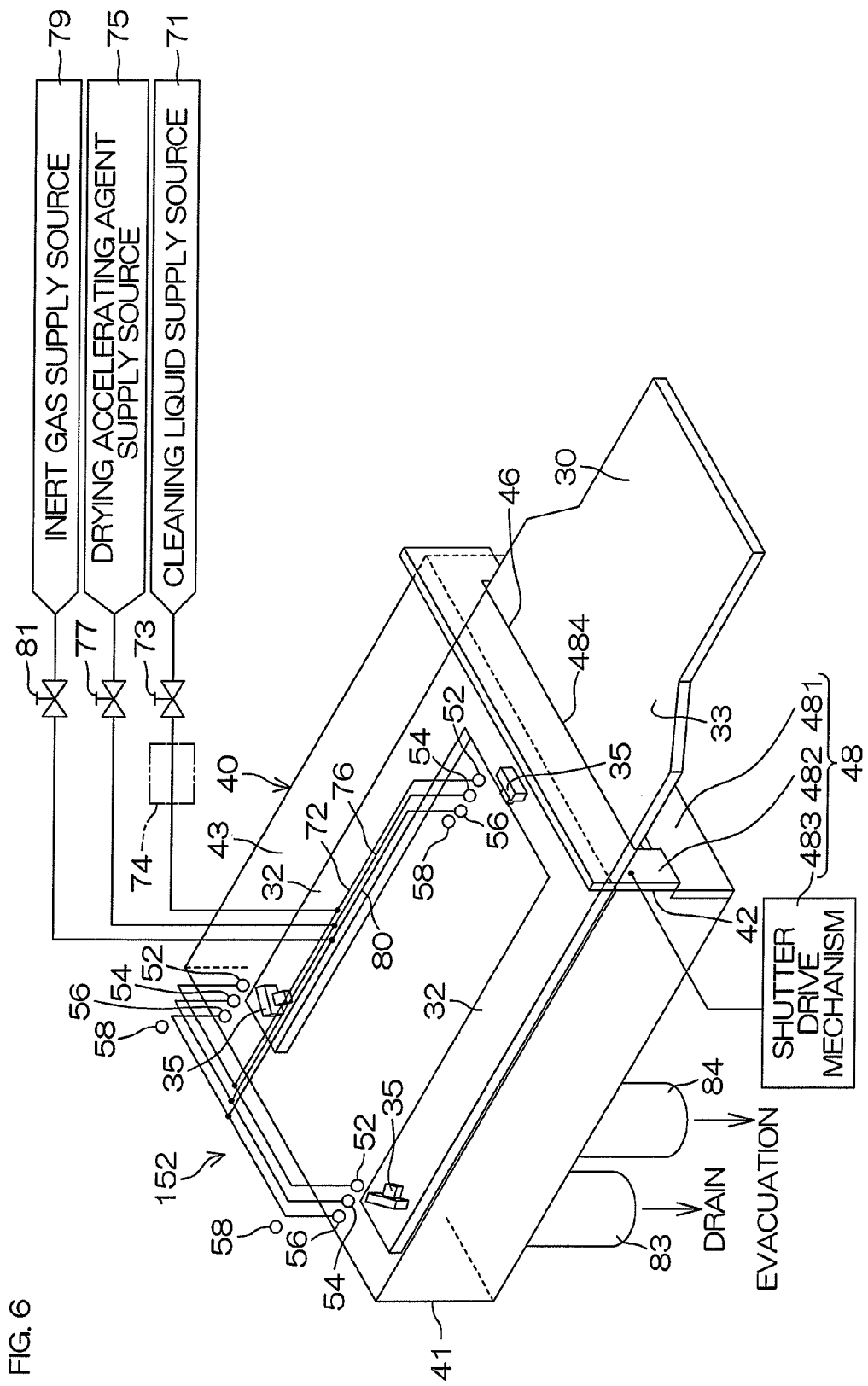
FIG. 6 is a schematic perspective view for explaining the construction of a second hand cleaning unit.

FIG. 6 is a schematic perspective view for explaining the construction of the second hand cleaning unit 152. In FIG. 6, components corresponding to those shown in FIG. 2B are designated by the same reference characters. The second hand cleaning unit 152 includes only the arrangement for cleaning the main transport hand 30 with the arrangement for cleaning the indexer hand 20 being omitted from the hand cleaning unit 15 of the first embodiment. More specifically, the second hand cleaning unit 152 has substantially the same construction as the hand cleaning unit 15, except that the first shutter mechanism 47, the cleaning liquid nozzles 51, the drying accelerating agent nozzles 53, the inert gas nozzles 55 and the UV lamps 57 are omitted from the hand cleaning unit 15. That is, the second hand cleaning unit 152 includes a second shutter mechanism 48 provided on a second end face 42 thereof to be opposed to the main transport robot 12 for opening and closing a second hand receiving port 46. Further, cleaning liquid nozzles 52, drying accelerating agent nozzles 54, inert gas nozzles 56 and UV lamps 58 are disposed in a hand treatment space 43 as corresponding in position to the substrate guides 35 of the main transport hand 30.

With this arrangement, the indexer hand 20 can be cleaned by the first hand cleaning unit 151, and the main transport hand 30 can be cleaned by the second hand cleaning unit 152. The first and second hand cleaning units 151, 152 are respectively disposed above and below the transfer unit 9 in the transport passage 8. That is, the first and second hand cleaning units 151, 152 at least partly overlap each other as seen in plan. Therefore, it is possible to additionally provide the hand cleaning function without increasing the occupation area (footprint) of the substrate treatment apparatus, thereby substantially preventing substrate transportation failures.

Figure 7:
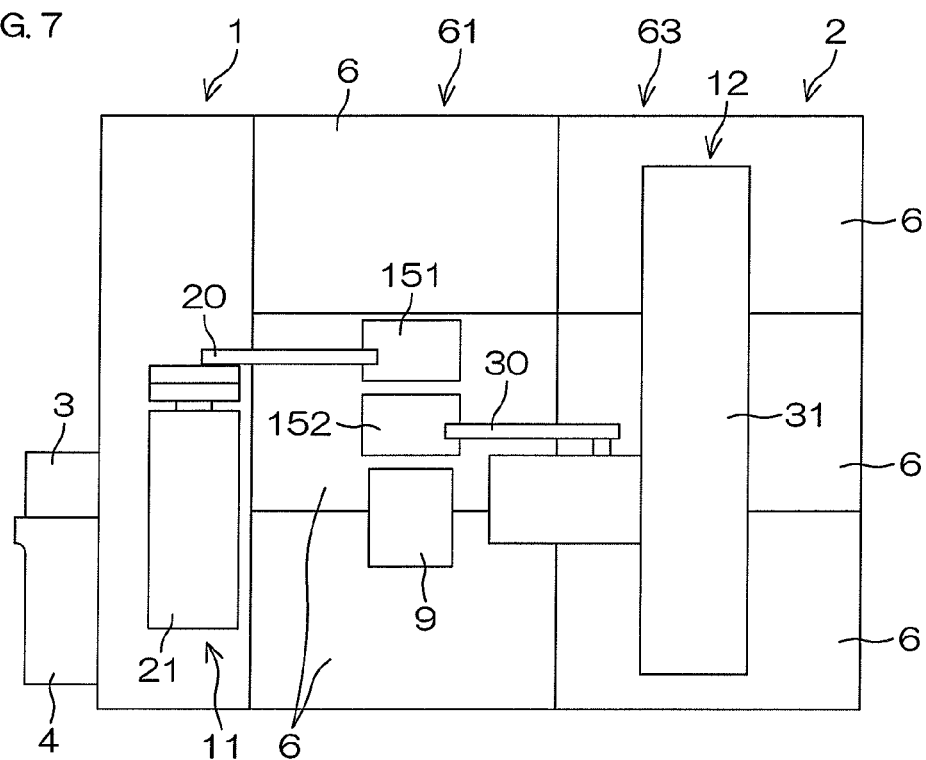
FIG. 7 is a schematic vertical sectional view showing a variation of the second embodiment.

FIG. 7 is a schematic vertical sectional view showing a variation of the second embodiment. In this variation, both of the first and second hand cleaning units 151, 152 are disposed above the transfer unit 9. In FIG. 7, the first hand cleaning unit 151 is disposed above the second hand cleaning unit 152, but the vertical positional relationship between the first and second hand cleaning units 151, 152 may be inverted.

Figure 8:
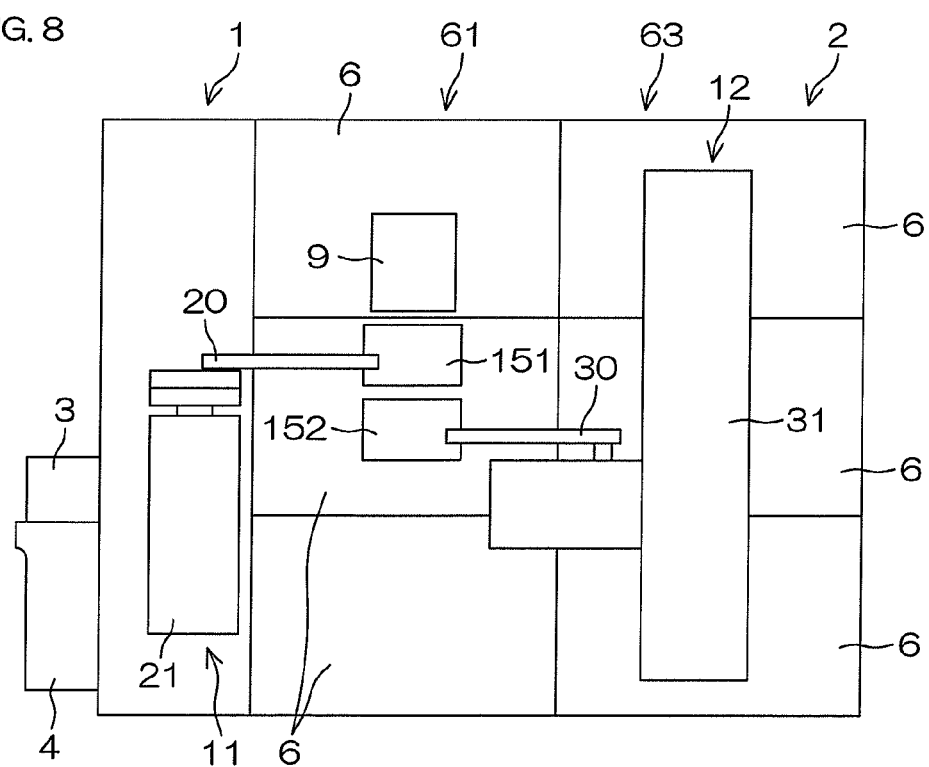
FIG. 8 is a schematic vertical sectional view showing another variation of the second embodiment.

FIG. 8 is a schematic vertical sectional view showing another variation of the second embodiment. In this variation, both of the first and second hand cleaning units 151, 152 are disposed below the transfer unit 9. In FIG. 8, the first hand cleaning unit 151 is disposed above the second hand cleaning unit 152, but the vertical positional relationship between the first and second hand cleaning units 151, 152 may be inverted.

Figure 9A:
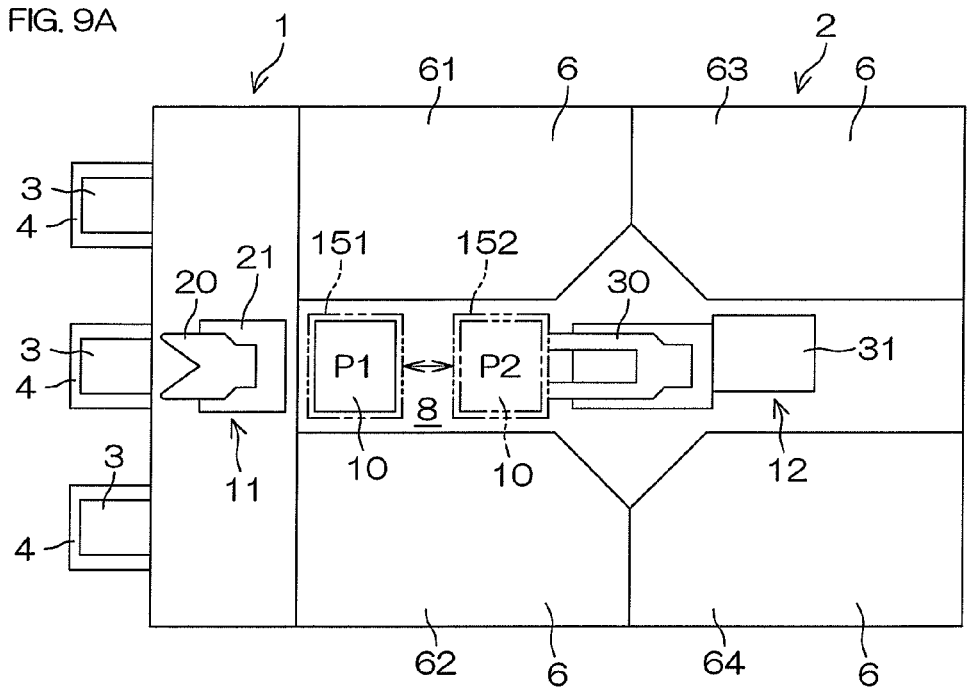
FIG. 9A is a schematic plan view for explaining a layout in a substrate treatment apparatus according to a third embodiment of the present invention.
Figure 9B:
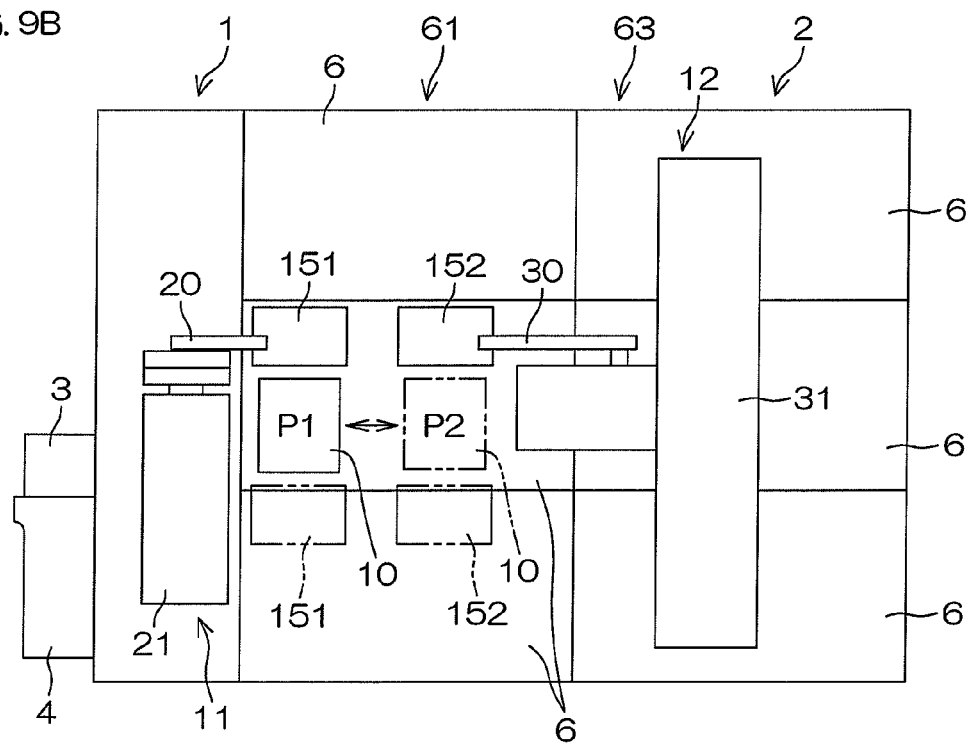
FIG. 9B is a schematic vertical sectional view of the substrate treatment apparatus.

FIG. 9A is a schematic plan view for explaining a layout in a substrate treatment apparatus according to a third embodiment of the present invention, and FIG. 9B is a schematic vertical sectional view of the substrate treatment apparatus. In FIGS. 9A and 9B, components corresponding to those shown in FIGS. 1A, 1B and 4 are designated by the same reference characters as in FIGS. 1A, 1B and 4. In this embodiment, a shuttle transport mechanism 10 is used for substrate transfer between the indexer robot 11 and the main transport robot 12. The shuttle transport mechanism 10 is disposed in the transport passage 8, and is reciprocally moved between a first substrate transfer position P1 adjacent to the indexer robot 11 and a second substrate transfer position P2 adjacent to the main transport robot 12 to transport a substrate. That is, the indexer robot 11 transfers an untreated substrate to the shuttle transport mechanism 10 at the first substrate transfer position P1. The shuttle transport mechanism 10 transports the received untreated substrate to the second substrate transfer position P2. The main transport robot 12 receives the untreated substrate from the shuttle transport mechanism 10 at the second substrate transfer position P2. Further, the main transport robot 12 transfers a treated substrate to the shuttle transport mechanism 10 at the second substrate transfer position P2. The shuttle transport mechanism 10 transports the treated substrate to the first substrate transfer position P1. The indexer robot 11 receives the treated substrate from the shuttle transport mechanism 10 at the first substrate transfer position P1. Thus, the substrate transfer between the indexer robot 11 and the main transport robot 12 is mediated by the shuttle transport mechanism 10. This arrangement is employed where the indexer robot 11 and the main transport robot 12 are spaced a great distance from each other and cannot access the same position (substrate transfer position) as seen in plan. More specifically, this arrangement is employed, for example, where the indexer robot 11 and/or the main transport robot 12 each have a shorter hand movement distance so that the movement range of the indexer hand 20 does not overlap the movement range of the main transport hand 30.

The first hand cleaning unit 151 for the indexer hand 20 is disposed above the shuttle transport mechanism 10 at the first substrate transfer position P1. The second hand cleaning unit 152 for the main transport hand 30 is disposed above the shuttle transport mechanism 10 at the second substrate transfer position P2. That is, the first and second hand cleaning units 151, 152 are disposed in the transport passage 8 so as to at least partly overlap the movement range of the shuttle transport mechanism 10 (substrate transfer positions) as seen in plan. Thus, the arrangements for cleaning the hands 20, 30 are additionally provided in the substrate treatment apparatus without any increase in the footprint of the apparatus, thereby reducing the transportation failures.

As indicated by phantom lines in FIG. 9B, the first hand cleaning unit 151 may be disposed below the shuttle transport mechanism 10 at the first substrate transfer position P1. Similarly, the second hand cleaning unit 152 may be disposed below the shuttle transport mechanism 10 at the second substrate transfer position P2. More specifically, both of the first and secondhand cleaning units 151, 152 may be disposed below the transport passage of the shuttle transport mechanism 10. Alternatively, one of the first and secondhand cleaning units 151, 152 may be disposed above the transport passage of the shuttle transport mechanism 10, and the other hand cleaning unit may be disposed below the transport passage of the shuttle transport mechanism 10.

Figure 10A:
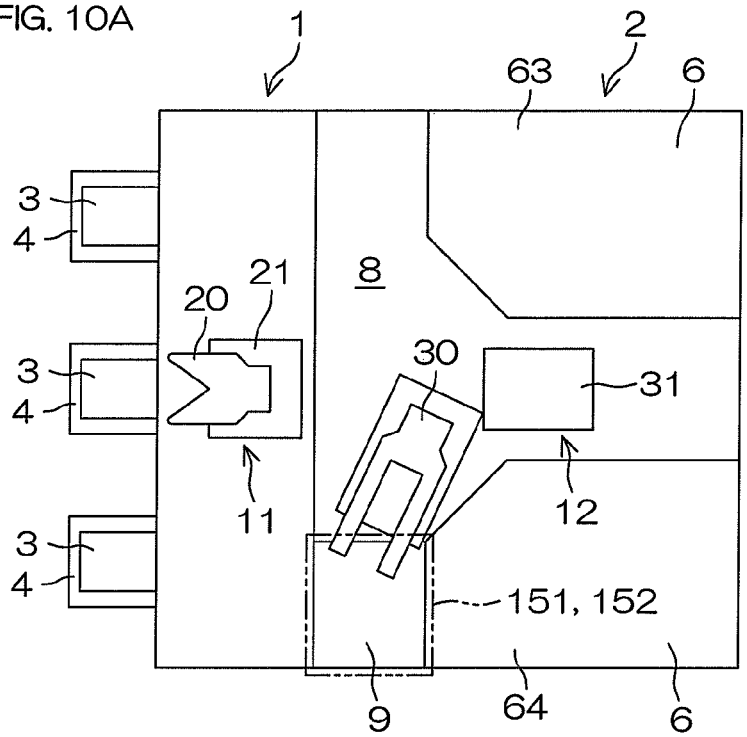
FIG. 10A is a schematic plan view for explaining a layout in a substrate treatment apparatus according to a fourth embodiment of the present invention.
Figure 10B:
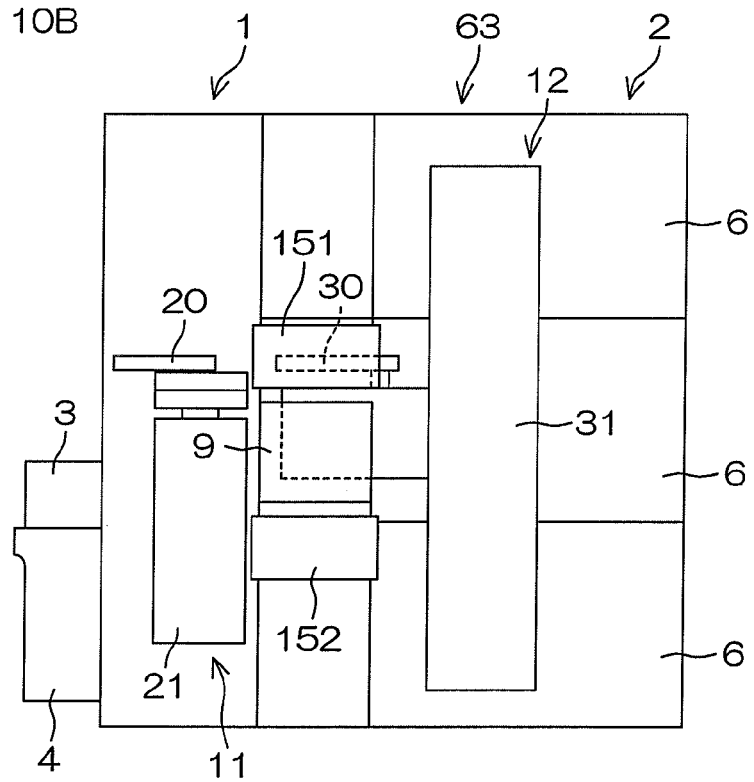
FIG. 10B is a schematic vertical sectional view of the substrate treatment apparatus.

FIG. 10A is a schematic plan view for explaining a layout in a substrate treatment apparatus according to a fourth embodiment of the present invention, and FIG. 10B is a schematic vertical sectional view of the substrate treatment apparatus. In FIGS. 10A and 10B, components corresponding to those shown in FIG. 1A are designated by the same reference characters as in FIG. 1A. In this substrate treatment apparatus, the process section 2 includes two treatment unit groups 63, 64 juxtaposed as seen in plan. The main transport robot 12 is disposed between these two treatment unit groups 63, 64 and the indexer section 1. In FIG. 10B, however, the treatment unit group 64 is not shown so that the main transport robot 12 can be seen. The transfer unit 9 for the substrate transfer between the indexer robot 11 and the main transport robot 12 is disposed between the treatment unit group 64 and the indexer section 1. In this embodiment, the substrate is transferred between the indexer robot 11 and the main transport robot 12 via the transfer unit 9 along an angled route as seen in plan, although the substrate is transferred between the indexer robot 11 and the main transport robot 12 via the transfer unit 9 along a linear route as seen in plan in the aforementioned embodiment.

In this embodiment, the first hand cleaning unit 151 for the indexer hand 20 is disposed above the transfer unit 9, and the second hand cleaning unit 152 for the main transport hand 30 is disposed below the transfer unit 9 (as indicated by a phantom line in FIG. 10A). That is, the first and second hand cleaning units 151, 152 are located so as to at least partly overlap the transfer unit 9 as seen in plan. Thus, the arrangements for cleaning the hands 20, 30 can be provided without any increase in the occupation area (footprint) of the substrate treatment apparatus, thereby improving the reliability of the substrate transportation.

The hand receiving port of the first hand cleaning unit 151 is directed toward the indexer robot 11. Similarly, the hand receiving port of the second hand cleaning unit 152 is directed toward the main transport robot 12.

The vertical positional relationship between the first hand cleaning unit 151 and the second hand cleaning unit 152 may be inverted so as to locate the firsthand cleaning unit 151 below the transfer unit 9 and locate the second hand cleaning unit 152 above the transfer unit 9. Further, both of the first and second hand cleaning units 151, 152 may be disposed above the transfer unit 9, or may be disposed below the transfer unit 9. In this case, either of the first and second hand cleaning units 151, 152 may be located at a higher level.

Further, one or two hand cleaning units which are each capable of receiving and cleaning both of the indexer hand 20 and the main transport hand 30 may be provided above or below the transfer unit 9. Such hand cleaning units may be respectively provided above and below the transfer unit 9. The hand cleaning units each have substantially the same construction as the hand cleaning unit 15 of the first embodiment. In this embodiment, however, an indexer hand accessing direction in which the indexer hand 20 accesses the hand cleaning unit is not aligned with a main transport hand accessing direction in which the main transport hand 30 accesses the hand cleaning unit as seen in plan. Therefore, the two hand receiving ports should be respectively directed toward the indexer robot 11 and the main transport robot 12.

While the embodiments of the present invention have thus been described, the invention may be embodied in other ways. In the embodiments described above, the present invention is applied to the substrate treatment apparatuses which are adapted to transport the substrate between the indexer robot and the main transport robot by way of example. However, the present invention may be applied to a substrate treatment apparatus which, for example, includes a plurality of process sections having respective main transport robots, and a hand cleaning unit disposed above and/or below a substrate transfer place at which a substrate is transferred between the main transport robots.

Further, a single hand cleaning unit having a single hand receiving port may be provided, and adapted to receive the indexer hand 20 and the main transport hand 30 through the single hand receiving port at different timings to perform the indexer hand cleaning process and the main transport hand cleaning process in a time-staggered manner. In this case, a unit rotation mechanism is preferably provided, which is adapted to rotate the hand cleaning unit about a vertical axis so as to direct the hand receiving port of the hand cleaning unit toward the indexer robot 11 or the main transport robot 12.

In the embodiments described above, the hand cleaning units are located above and/or below the substrate transfer unit in three-dimensional relation by way of example. However, the substrate may be transferred directly between hands of first and second substrate transport robots rather than via the substrate transfer unit. In this case, the hand cleaning unit may be located at a position accessible by the hands above and/or below a substrate transfer place at which the substrate is directly transferred.

In the embodiments described above, the hand cleaning unit includes the cleaning liquid nozzles, the drying accelerating agent nozzles, the inert gas nozzles and the UV lamps by way of example, but the hand cleaning unit is not necessary required to include all these components. For example, the hand cleaning unit may include only the cleaning liquid nozzles, include only the cleaning liquid nozzles and the inert gas nozzles, include only the cleaning liquid nozzles, the inert gas nozzles and the UV lamps, or include only the UV lamps. Alternatively, other type of hand cleaning unit may be provided as the hand cleaning unit.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

The present application corresponds to Japanese Patent Application No. 2011-061479 filed in the Japan Patent Office on Mar. 18, 2011, the disclosure of which is incorporated herein by reference in its entirety.

What is claimed is:

1. A substrate treatment apparatus comprising:
    a first substrate transport robot having a first hand which holds a substrate;
    a second substrate transport robot having a second hand which holds the substrate; and
    said first and second robots being accessible to a substrate transport passage;
    said substrate transport passage being defined between or outside treatment units;
    a hand cleaning unit which is accessible by the first hand of the first substrate transport robot and the second hand of the second substrate transport robot, wherein the hand cleaning unit is configured and disposed in a position within said substrate transfer passage for cleaning the first hand and the second hand, being disposed above or below a substrate transfer unit within said substrate transfer passage at which the substrate is transferred between the first hand and the second hand.

2. The substrate treatment apparatus according to claim 1, further comprising a substrate holding unit disposed at the substrate transfer place for holding the substrate.

3. The substrate treatment apparatus according to claim 1, wherein the hand cleaning unit includes a housing defining a hand treatment space in which the first and second hands are each accommodated to be treated.

4. The substrate treatment apparatus according to claim 3, wherein the housing has a hand receiving port through which the first and second hands are each inserted into and retracted from the hand treatment space.

5. The substrate treatment apparatus according to claim 4, wherein the hand receiving port includes a first hand receiving port and a second hand receiving port provided at different positions and configured such that the first hand and the second hand are insertable into and retractable from the hand treatment space through the first receiving port and the second receiving port, respectively.

6. The substrate treatment apparatus according to claim 5, wherein the first hand receiving port is directed toward the first substrate transport robot, and the second hand receiving port is directed toward the second substrate transport robot.

7. The substrate treatment apparatus according to claim 4, wherein the housing has a single hand receiving port.

8. The substrate treatment apparatus according to claim 1, wherein
    the hand cleaning unit includes a first hand cleaning unit including a first housing defining a first hand treatment space in which the first hand can be accommodated to be treated, and a second hand cleaning unit including a second housing defining a second hand treatment space in which the second hand can be accommodated to be treated,
    the first housing has a first hand receiving port through which the first hand can be inserted into and retracted from the first hand treatment space,
    the second housing has a second hand receiving port through which the second hand can be inserted into and retracted from the second hand treatment space,
    the first hand receiving port is directed toward the first substrate transport robot, and
    the second hand receiving port is directed toward the second substrate transport robot.

9. The substrate treatment apparatus according to claim 4, further comprising a shutter mechanism which opens and closes the hand receiving port.

10. The substrate treatment apparatus according to claim 4, wherein an evacuation passage for evacuating the hand treatment space is connected to the housing.

11. The substrate treatment apparatus according to claim 4, wherein the hand cleaning unit includes a cleaning liquid supply unit which supplies a cleaning liquid to each of the first and second hands inserted into the hand treatment space, and a liquid drain for draining a liquid from the hand treatment space is connected to the housing.

12. The substrate treatment apparatus according to claim 11, wherein the cleaning liquid supply unit includes a cleaning liquid nozzle disposed in the hand treatment space so as to correspond in position to a substrate contact portion of each of the first and second hands.

13. The substrate treatment apparatus according to claim 11, further comprising a drying accelerating agent supply unit which supplies a drying accelerating agent to each of the first and second hands inserted into the hand treatment space.

14. The substrate treatment apparatus according to claim 1, wherein the hand cleaning unit includes a UV lamp which irradiates each of the first and second hands with ultraviolet radiation.

15. The substrate treatment apparatus according to claim 1, wherein the hand cleaning unit is at least partly overlapped with the substrate transfer place when viewed in plan.

16. A substrate treatment apparatus comprising:
a first substrate transport robot having a first hand which holds a substrate;
a second substrate transport robot having a second hand which holds the substrate; and
said first and second robots being accessible to a substrate transport passage;
said substrate transport passage being defined between or outside treatment units;
a hand cleaning unit which is accessible by the first hand of the first substrate transport robot and the second hand of the second substrate transport robot for cleaning the first hand and the second hand, the hand cleaning unit being disposed in said substrate transport passage through which the substrate is transported, wherein the hand cleaning unit is at least partly overlapped, when viewed in plan, with a substrate transfer unit within the substrate transport passage at which the substrate is transferred between the first hand and the second hand.

17. The substrate treatment apparatus according to claim 1, wherein the hand cleaning unit is disposed in a substrate transport passage through which the substrate is transported by the first and second substrate transport robots.

18. The substrate treatment apparatus according to claim 1, wherein the hand cleaning unit is simultaneously accessible by the first hand of the first substrate transport robot and the second hand of the second substrate transport robot.

19. The substrate treatment apparatus according to claim 16, wherein the first substrate transport robot and the second substrate transport robot are configured to transport the substrate through the substrate transport passage.

20. The substrate treatment apparatus according to claim 16, wherein the hand cleaning unit is simultaneously accessible by the first hand of the first substrate transport robot and the second hand of the second substrate transport robot.

* * * * *